*US006265947B1*

(12) United States Patent
Klemmer et al.

(10) Patent No.: US 6,265,947 B1
(45) Date of Patent: Jul. 24, 2001

(54) POWER CONSERVING PHASE-LOCKED LOOP AND METHOD

(75) Inventors: Nikolaus Klemmer, Apex; Steven L. White, Raleigh, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/481,461

(22) Filed: Jan. 11, 2000

(51) Int. Cl.[7] .................................................. H03L 7/095
(52) U.S. Cl. ............................ 331/17; 327/148; 327/158
(58) Field of Search .................................. 327/148, 157; 331/14, 15, 27, 17

(56) References Cited

U.S. PATENT DOCUMENTS

| 5,315,270 | * | 5/1994 | Leonowich | 331/1 A |
|---|---|---|---|---|
| 5,351,015 | | 9/1994 | Masumoto et al. | 331/1 R |
| 5,359,297 | | 10/1994 | Hodel et al. | 331/1 A |
| 5,376,974 | | 12/1994 | Suzuki et al. | 348/735 |
| 5,394,444 | * | 2/1995 | Silvey et al. | 375/374 |
| 5,699,020 | * | 12/1997 | Jefferson | 331/17 |
| 5,783,972 | * | 7/1998 | Nishikawa | 331/17 |
| 5,831,483 | * | 11/1998 | Fukuda | 331/17 |
| 6,097,227 | * | 8/2000 | Hayashi | 327/158 |

FOREIGN PATENT DOCUMENTS

| 0810736A1 | 5/1997 | (EP) . |
| 1-0322197 | 4/1998 | (JP) . |

* cited by examiner

Primary Examiner—Tuan T. Lam
(74) Attorney, Agent, or Firm—Coats & Bennett, P.L.L.C.

(57) ABSTRACT

A power conserving phase-locked loop achieves power savings by adding a switch which selectively enables the bias current for the charge pump associated with the phase comparator of the phase-locked loop. The switch is connected by a logic circuit to a counter that tracks the expected arrival time of a signal edge of the reference signal. Immediately prior to the arrival of the expected signal edge, the switch is enabled, thereby creating and applying the bias current to activate the charge pump in the event that a correction is needed to maintain the "lock" in the phase-locked loop. When the signal edge passes, the bias current is turned off again before the arrival of the next signal edge. This switching may result in a ten percent duty cycle in the biasing current, resulting in approximately a ninety percent power savings. The phase-locked loop may be used for a variety of applications, such as a frequency synthesizer in a receiver chain of wireless communications mobile terminals, where power consumption is a concern.

27 Claims, 7 Drawing Sheets

POWER CONSERVING PHASE-LOCKED LOOP AND METHOD

BACKGROUND OF THE INVENTION

The present invention relates to phase-locked loops, and more particularly to a power conserving phase-locked loop such as may be used as a frequency synthesizer in wireless communications devices.

Phase-locked loops are used to perform a wide variety of tasks, such as frequency synthesis, AM and FM detection, frequency multiplication, tone decoding, pulse synchronization of signals from noisy sources, and regeneration of clean signals, particularly in wireless communications devices. Because batteries power many wireless communications devices that use a phase-locked loop, such as cellular telephones and the like, and because battery lifetime is a major concern for many consumers, new designs for phase-locked loops that reduce power consumption are obviously desirable.

Typically, phase-locked loops include an oscillator for generating the output signal and suitable comparing/locking circuitry. The comparing/locking circuitry outputs a control signal to the oscillator to control the frequency and phase output of the oscillator, thereby ensuring that the output signal is at the desired frequency and phase. The comparing/locking circuitry typically utilizes a bias current to help generate the control signal. In prior art phase-locked loops, the bias current is generated the entire time the phase-locked loop is in an active state (i.e., turned on) and therefore provides a constant drain on the batteries powering the device. While the bias current may be a small fraction of the final output current, it nevertheless represents a significant part of the total current consumption of the phase-locked loop. As such, a new design of phase-locked loop that helps reduce the power drain of the bias current supply would be desirable, particularly in helping to meet consumer demand for improved wireless communications devices with longer battery life.

BRIEF SUMMARY OF THE INVENTION

The present invention provides a power conserving phase-locked loop that may be used for a variety of applications, for example as a frequency synthesizer in a receiver chain of wireless communications mobile terminals and other battery-powered devices where power consumption is a concern. Power savings are achieved by adding a switch which selectively turns on or enables the bias current for the charge pump associated with the phase comparator of the phase-locked loop. The switch is connected by a logic circuit to a counter that tracks the expected arrival time of a signal edge of the reference signal. Immediately prior to the arrival of the expected signal edge, the switch is enabled, thereby creating and applying the bias current to activate the charge pump in the event that a correction is needed to maintain the "lock" in the phase-locked loop. When the signal edge passes, the bias current is turned off again before the arrival of the next signal edge. In some embodiments, this switching effectuates approximately a ten percent duty cycle in the biasing current, resulting in approximately a ninety percent power savings.

DETAILED DESCRIPTION OF THE INVENTION

The present invention is a phase-locked loop (PLL) that utilizes less power when in the locked state. It is intended that, among other places, the PLL of the present invention may be used in a dual conversion receiver chain of a wireless communications mobile terminal. As such, a brief discussion of a wireless communications mobile terminal may be helpful in understanding the present invention.

Figure 1:
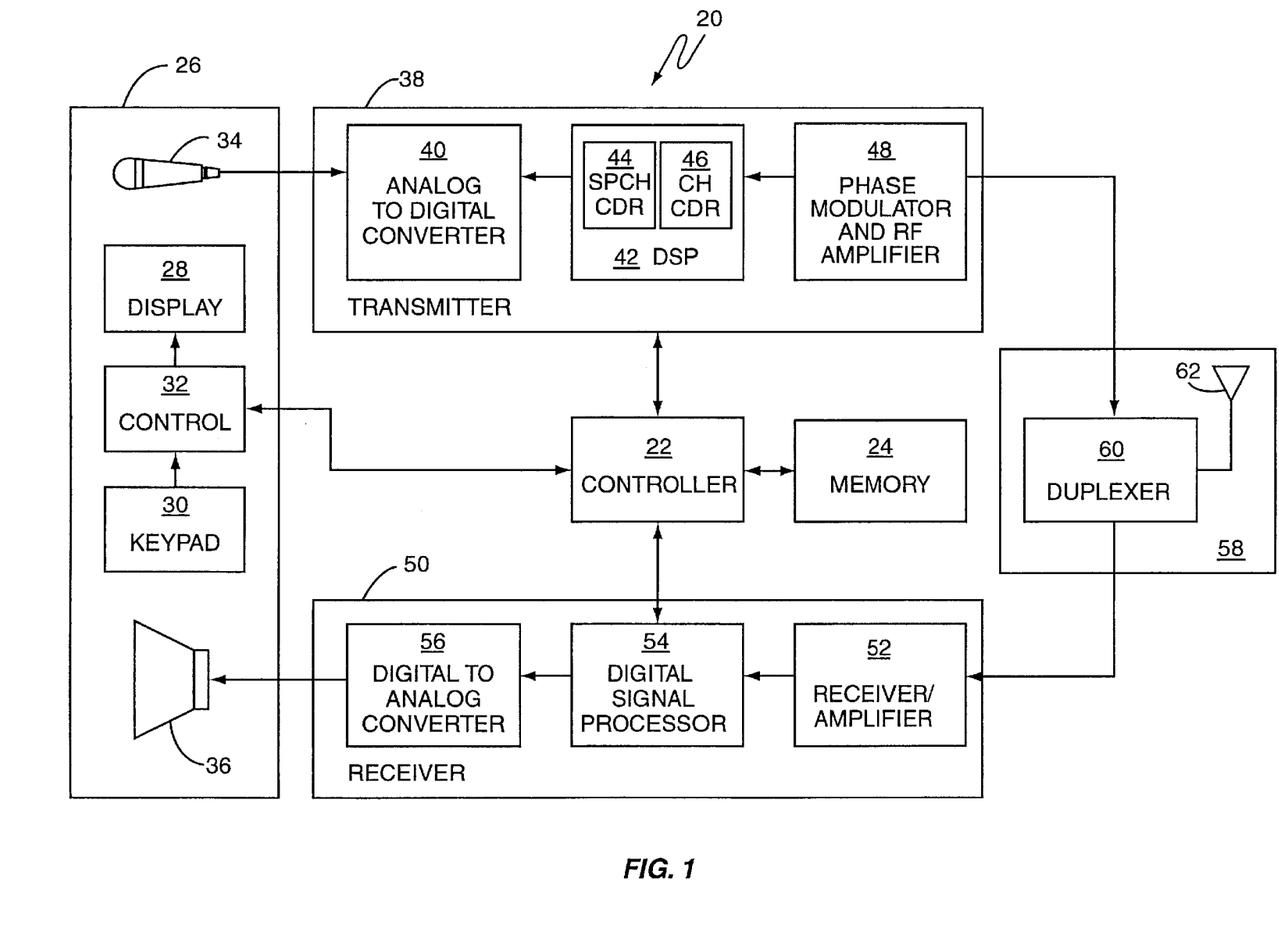
FIG. 1 shows a wireless communications mobile terminal that may incorporate the present invention.

A mobile terminal 20 typically includes a controller 22, an operator interface 26, a transmitter 38, a receiver 50, and an antenna assembly 58. The operator interface 26 typically includes a display 28, keypad 30, control unit 32, microphone 34, and a speaker 36. The display 28 allows the operator to see dialed digits, call status, and other service information. The keypad 30 allows the operator to dial numbers, enter commands, and select options. The control unit 32 interfaces the display 28 and keypad 30 with the controller 22. The microphone 34 receives acoustic signals from the user and converts the acoustic signals to an analog electrical signal. The speaker 36 converts analog electrical signals from the receiver 50 to acoustic signals which can be heard by the user.

The analog electrical signal from the microphone 34 is supplied to the transmitter 38. The transmitter 38 includes an analog to digital converter 40, a digital signal processor 42, and a phase modulator and RF amplifier 48. The analog to digital converter 40 changes the analog electrical signal from the microphone 34 into a digital signal. The digital signal is passed to the digital signal processor (DSP) 42, which contains a speech coder 44 and channel coder 46. The speech coder 44 compresses the digital signal and the channel coder 46 inserts error detection, error correction and signaling information. The DSP 42 may include, or may work in conjunction with, a DTMF tone generator (not shown). The compressed and encoded signal from the digital signal processor 42 is passed to the phase modulator and RF amplifier 48, which are shown as a combined unit in FIG. 1. The modulator converts the signal to a form which is suitable for transmission on an RF carrier. The RF amplifier 48 then boosts the output of the modulator for transmission via the antenna assembly 58.

The receiver 50 includes a receiver/amplifier 52, digital signal processor 54, and a digital to analog converter 56. Signals received by the antenna assembly 58 are passed to the receiver/amplifier 52, which shifts the frequency spectrum, and boosts the low-level RF signal to a level appropriate for input to the digital signal processor 54.

The digital signal processor 54 typically includes an equalizer to compensate for phase and amplitude distortions in the channel corrupted signal, a demodulator for extracting bit sequences from the received signal, and a detector for determining transmitted bits based on the extracted sequences. A channel decoder detects and corrects channel errors in the received signal. The channel decoder also includes logic for separating control and signaling data from speech data. Control and signaling data is passed to the controller 22. Speech data is processed by a speech decoder and passed to the digital to analog converter 56. The digital signal processor 54, may include, or may work in conjunction with, a DTMF tone detector (not shown). The digital to analog converter 56 converts the speech data into an analog signal which is applied to the speaker 36 to generate acoustic signals which can be heard by the user.

The antenna assembly 58 is connected to the RF amplifier of the transmitter 38 and to the receiver/amplifier 52 of the receiver 50. The antenna assembly 58 typically includes a duplexer 60 and an antenna 62. The duplexer 60 permits full duplex communications over the antenna 62.

The controller 22 coordinates the operation of the transmitter 38 and the receiver 50, and may for instance take the form of a common microprocessor. This coordination includes power control, channel selection, timing, as well as a host of other functions known in the art. The controller 22 inserts signaling messages into the transmitted signals and extracts signaling messages from the received signals. The controller 22 responds to any base station commands contained in the signaling messages, and implements those commands. When the user enters commands via the keypad 30, the commands are transferred to the controller 22 for action. Memory 24 stores and supplies information at the direction of the controller 22 and preferably includes both volatile and non-volatile portions.

Figure 2:
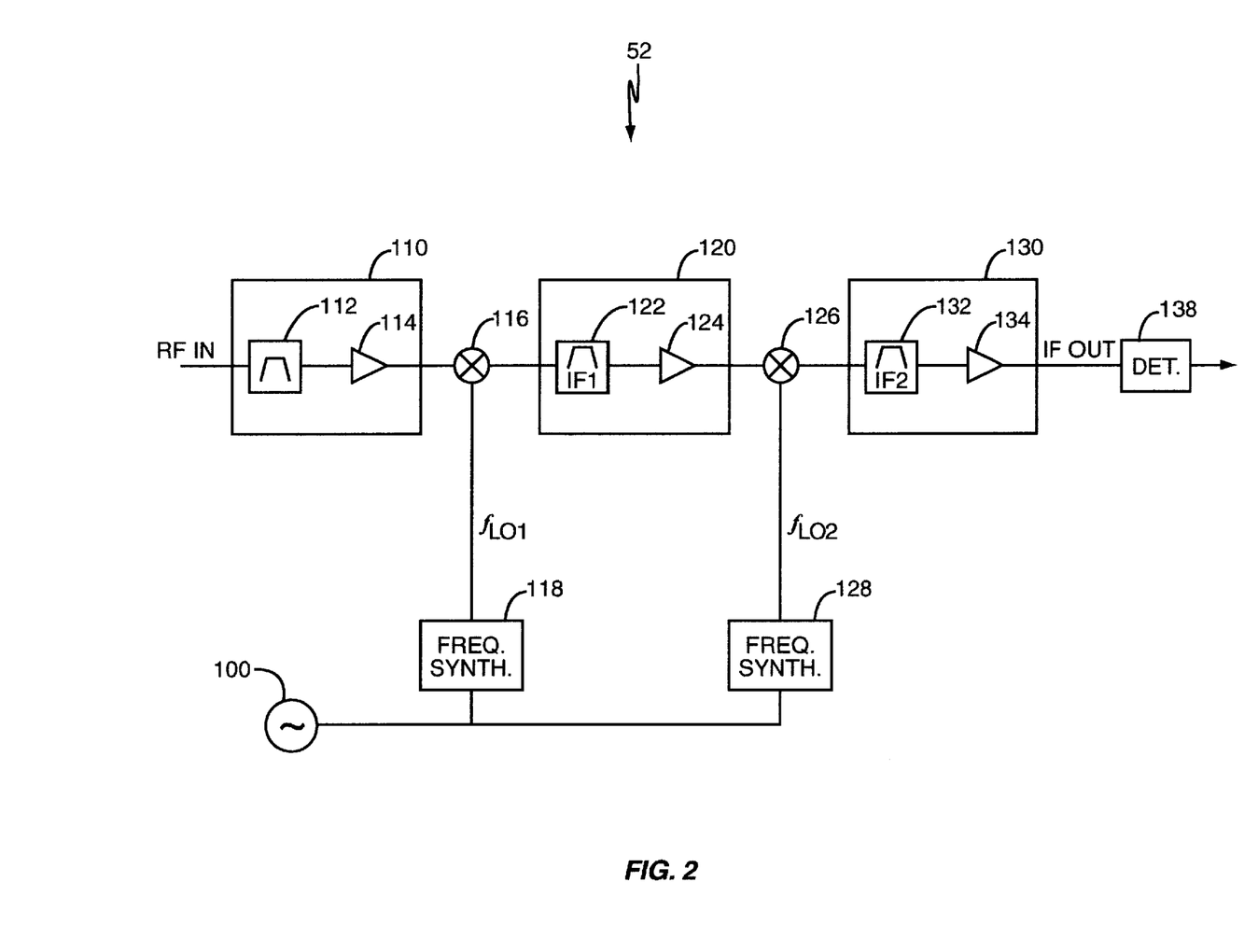
FIG. 2 shows a radio receiver such as is present in the mobile terminal of FIG. 1.

One embodiment of the receiver/amplifier 52 is shown in more detail in FIG. 2. Receiver/amplifier 52 includes a front end 110, a first mixer 116, a first intermediate frequency stage 120, a second mixer 126, a second intermediate frequency stage 130, and a detector 138. Signals received by the antenna 62 are applied to the input of front end 110. Front end 110 includes a preselector filter 112 and low-noise amplifier 114. The preselector filter 112 suppresses signals outside the primary band. The low-noise amplifier 114 increases the strength of the received signals passed by the filter 112. The mixer 116 converts the received signals to a first intermediate frequency. The injection signal ($f_{LO1}$) for mixer 116 is provided by a first frequency synthesizer 118 and is typically a low noise, high frequency signal. Typically, the output frequency of frequency synthesizer 118 is set by a controller, such as controller 22, to perform channel selection on the signals received at the antenna 62. Frequency synthesizer 118 may preferably be a phase-locked loop.

The output of mixer 116 is connected to the input of first intermediate frequency stage 120. First intermediate frequency stage 120 comprises a first intermediate frequency filter 122 followed by a first intermediate frequency amplifier 124. The purpose of the first intermediate frequency filter 122 is to reject the image frequency with respect to the second intermediate frequency and to provide some degree of adjacent channel suppression.

The output of the first intermediate frequency stage 120 is connected to the second mixer 126. The second mixer 126 converts the received signal to a second intermediate frequency. The injection signal ($f_{LO2}$) for the second mixer 126 is provided by a second frequency synthesizer 128. In the prior art, frequency synthesizer 128 is also a phase-locked loop, but separate from the phase-locked loop of frequency synthesizer 118. Typically, the output frequency of frequency synthesizer 128 is fixed and does not need to be changed when tuning to a different channel.

The output of the second mixer 126 is connected to the input of a second intermediate frequency stage 130 which comprises a second intermediate frequency filter 132 followed by a second intermediate frequency amplifier 134. The purpose of the second intermediate frequency filter 132 is to provide further adjacent channel suppression. The output of the second intermediate frequency stage 130 is connected to a detector 138 whose design is chosen according to the modulation scheme employed. For example, a receiver for FM signals would use a limiter followed by a discriminator as its detector, whereas a receiver for single sideband suppressed carrier signals would use a product detector or a synchronous detector.

Figure 3:
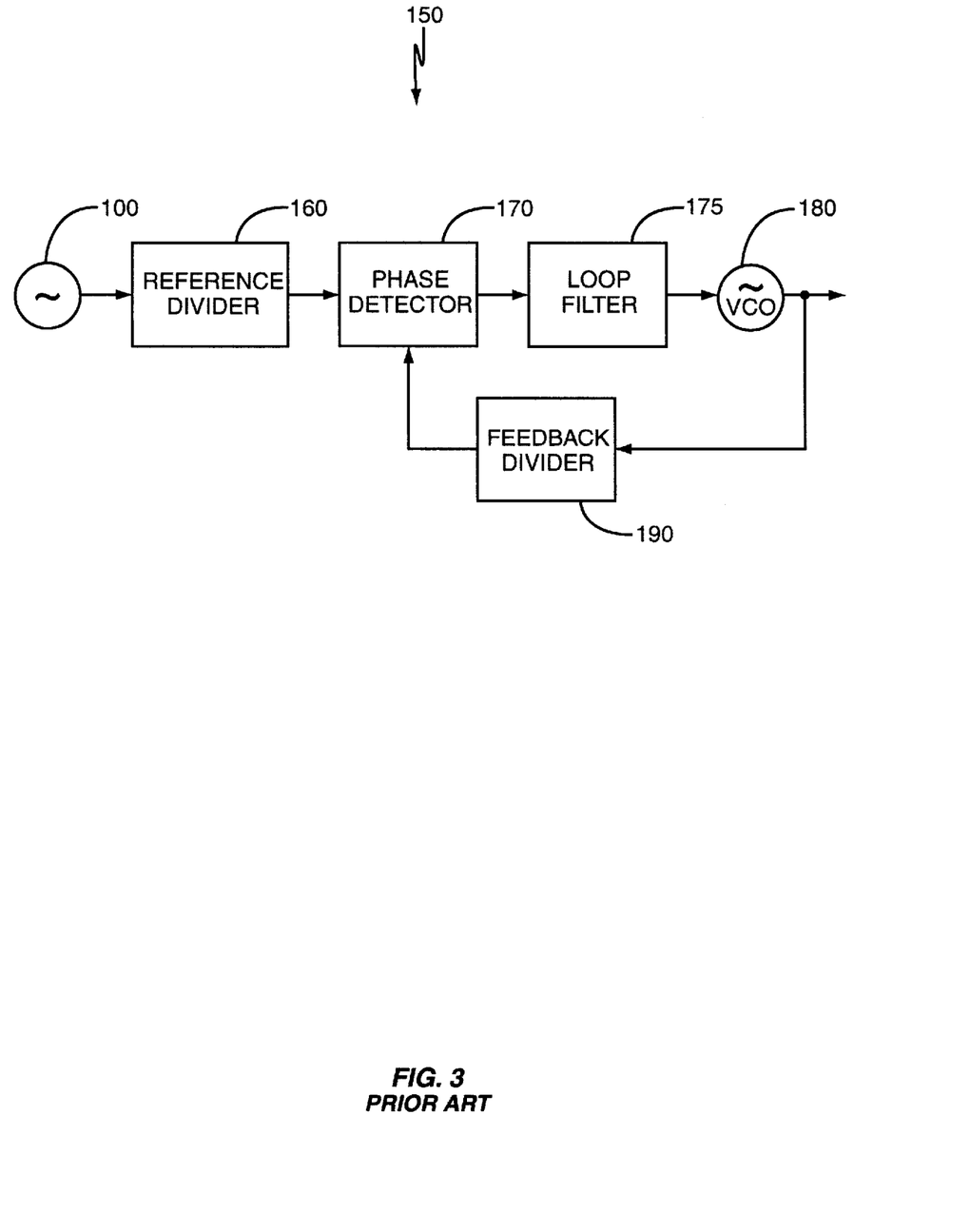
FIG. 3 shows a prior art phase-locked loop.

In the prior art, the frequency synthesizers 118 and 128 are made from conventional phase-locked loops (PLL) such as shown in FIG. 3 indicated generally by reference number 150. PLL 150 includes an oscillator 100, a reference divider 160, a phase detector 170, a filter 175, a low phase noise voltage controlled oscillator (VCO) 180, and a feedback divider 190. PLL 150 takes the known output of the reference oscillator 100 and sends it through the reference divider 160. Reference oscillator 100 generates a periodic signal at a fixed frequency that is known a priori within the mobile terminal 20 or other device in which the reference oscillator 100 is used. Further, the reference signal generated by the reference oscillator 100 is a periodic signal with rising and falling edges, for example a square wave. This divided reference signal is injected into the phase detector 170. Phase detector 170 is in turn connected to the filter 175 and the VCO 180. VCO 180 generates a periodic signal with rising and falling edges. This output signal from VCO 180 is the signal that is used in a mixer (such as mixer 116 or 126 in FIG. 2) or the like as required by the mobile terminal 20 incorporating the PLL 150. Additionally, the output from the VCO 180 is directed back to the phase detector 170 through the feedback divider 190. Phase detector 170 compares the inputs from the feedback divider 190 and the reference divider 160 and generates a correction signal, typically through a charge pump, to correct the output of the VCO 180 to match its phase to the phase of the input of the reference divider 160. That is, the phase detector 170 generates a signal which is filtered and then controls the VCO 180 so that VCO 180 outputs a signal that is at the correct frequency and phase.

The phase comparator 170 typically includes an output circuit, commonly known as a charge pump, that provides a bias current to the VCO 180 for correcting the output of the VCO 180. The charge pump has a transistor network and current source from which a bias current for the transistor network is derived. The charge pump either sinks or sources current depending on the phase difference between the input signals. When the feedback signal transitions occur before the reference signal transitions, the phase comparator 170 generates lead pulses and the charge pump sinks current supplied by the reference current source. Conversely, when the feedback signal transitions occur after the reference signal transitions, the phase comparator 170 generates lag pulses and the charge pump sources current to the VCO 180. In prior art phase-locked loops 150, such as that shown in FIG. 3, the bias current (sometimes called a reference current) is generated the entire time the phase-locked loop 150 is in an active state (i.e., turned on) and therefore provides a constant drain on the batteries powering the device.

Figure 4:
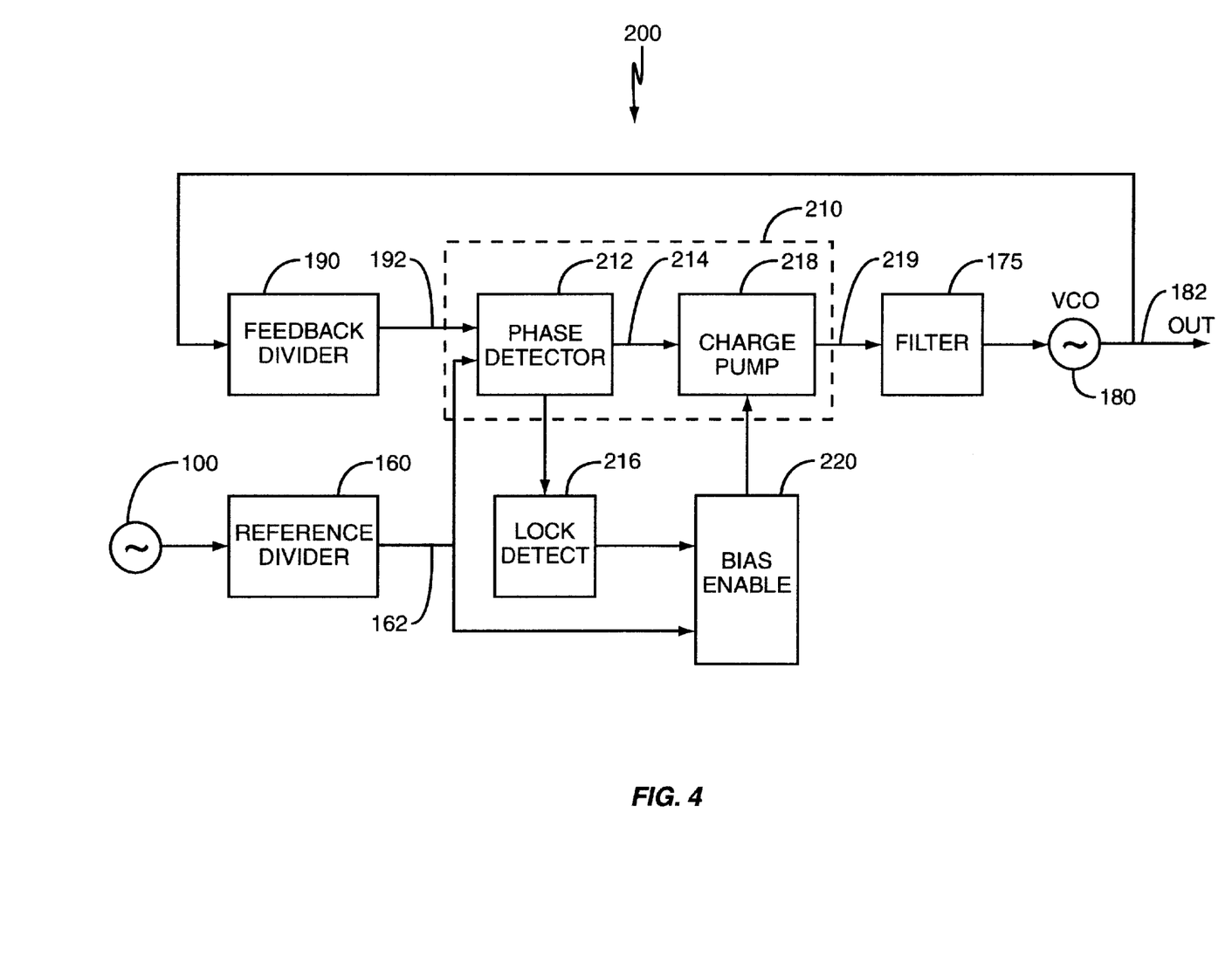
FIG. 4 shows one embodiment of the phase-locked loop of the present invention.

The present invention selectively enables this bias current so as to turn off the bias current when it is not needed, thereby saving power. One embodiment of a PLL utilizing this approach is shown in FIG. 4 and generally indicated by reference numeral 200. PLL 200 receives input from a reference oscillator 100 and includes a reference divider 160, a phase comparator 210, a loop filter 175, a VCO 180, a feedback divider 190, and a bias enable logic circuit 220. The phase comparator 210 includes a phase detector 212 and a charge pump 218. While it is common for PLL diagrams to incorporate the charge pump 218 into the phase detector 212, for understanding of the present invention it helps to think of them as conceptually discrete elements.

Reference oscillator 100 generates a periodic square wave that is input to the reference divider 160. Reference divider 160 divides the signal from the reference oscillator 100, thereby creating a reference signal 162. The reference signal 162 from the reference divider 160 is applied to one input of the phase detector 212. Reference signal 162 is also an input of the bias enable logic circuit 220. A feedback signal 192 derived from the final output signal of the PLL 200 is applied to the second input of the phase detector 212. Phase detector 212 compares the reference signal 162 with the feedback signal 192 and generates a phase error signal 214 that is a measure of the difference in phase between the two signals 162,192. The phase detector 212 communicates with a lock detect circuit 216 that generates a "lock" signal when the input signals 162,192 are in phase. The lock detect circuit 216 may be included in the phase detector 192, but this is not required and lock detected circuit 216 is shown separately in FIG. 4. For purposes of this application, "in phase" means that the difference between the relevant signals, such as input signals 162,192, is within predetermined limits, typically less than 1% variance. The lock signal from the lock detect circuit 216 is also applied to bias enable logic circuit 220.

The phase error signal 214 output by the phase detector 212 is applied to the charge pump 218. The phase error signal 214 comprises a sequence of lead or lag pulses when the input signals 162,192 are out of phase. A lead pulse is generated when the feedback signal transitions occur before the reference signal transitions. A lag pulse is generated when the feedback signal transitions occur after the reference signal transitions. The width of the lead and lag pulses are equal to the time between respective edges of the input signals 162,192. See FIG. 7, discussed further below.

Charge pump 218 produces a correction signal 219 that is used to control the VCO 180. Charge pump 218 receives the phase error signal 214 containing either lead or lag pulses and sinks current or sources current respectively during those pulses. Correction signal 219, after filtering, is applied to the VCO 180, which generates an output signal 182. When the input signals 162,192 are out of phase, the correction signal 219 causes the output signal to deviate in the direction of the reference signal 162. When the PLL 200 is in a locked state, the output signal 182 is at or near the desired frequency. The output signal 182 then can be used in a multitude of different ways, depending on the device in which the PLL 200 is used. For instance, output signal 182 may form injection signal ($f_{LO1}$) for first mixer 116 or injection signal ($f_{LO2}$) for second mixer 126. Additionally, the output signal 182 is fed back into feedback divider 190 which divides the signal thereby creating feedback signal 192.

Figure 5:
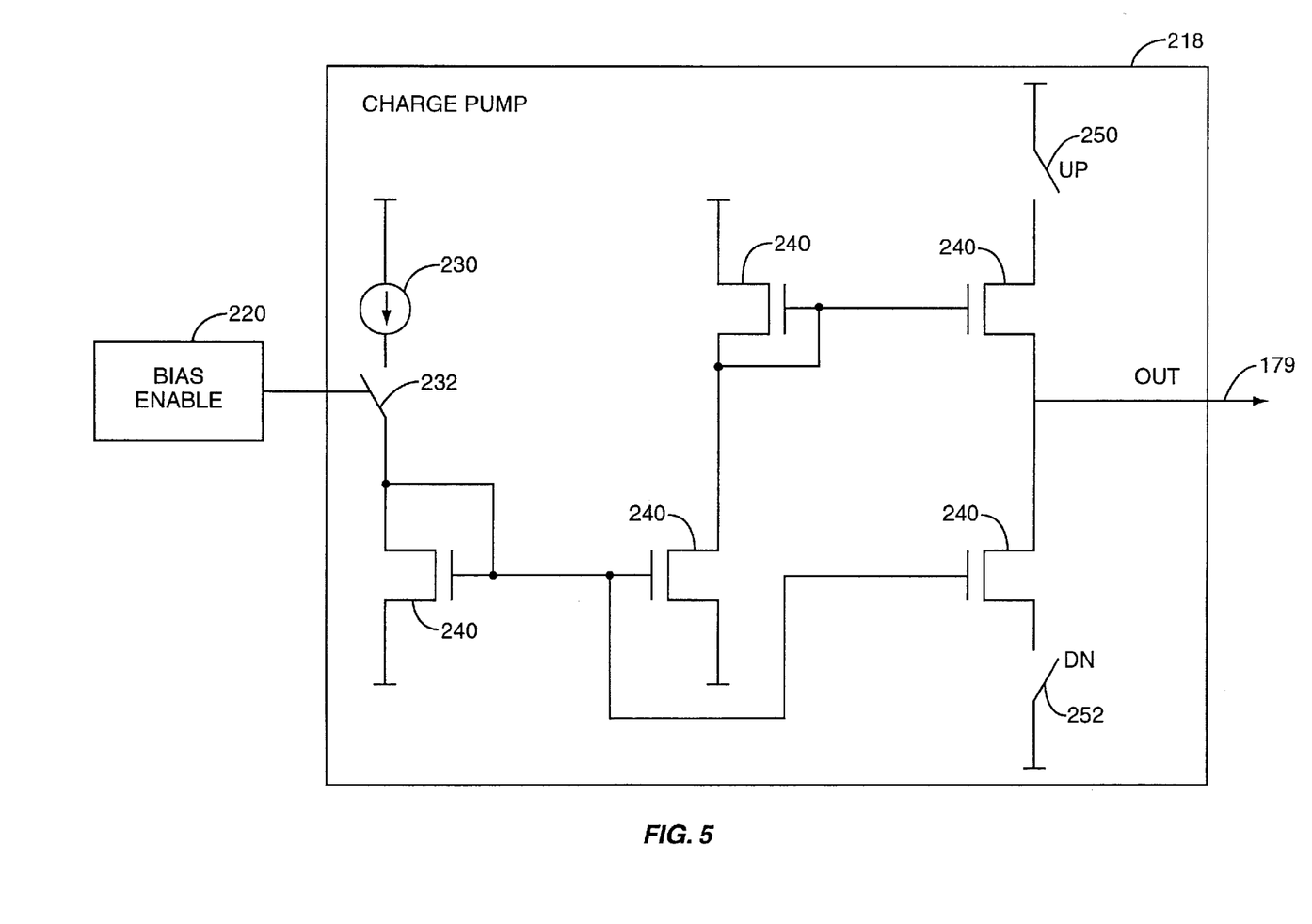
FIG. 5 is a schematic diagram of a portion of the phase-locked loop of FIG. 4.

FIG. 5 shows one embodiment of charge pump 218. It should be appreciated that there are many different ways to construct a charge pump 218, and the illustration of FIG. 5 is merely an exemplary embodiment. Charge pump 218 includes a biasing current source 230 that provides a biasing current to a transistor network comprising a plurality of transistors 240. Phase detector 212 controls the operation of gates 250,252 to control current flowing to the VCO 180 as is conventional. For example, if the feedback signal transitions occur before the reference signal transitions, gate 252 closes and the charge pump 218 sinks current during the lead pulses. Conversely, if the phase of the signal lags behind the phase of the reference signal, gate 250 closes and current is supplied to the VCO 180 during the lag pulses. Switch 232 is interposed between the current source 230 supplying a bias current to the charge pump 218 and the transistor network. Bias enable logic circuit 220 controls switch 232 to selectively enable and disable the bias current source 230. When switch 232 is open, the transistors 240 are not biased and no current passes from the charge pump 218.

The bias enable logic circuit 220 may take a variety of forms. For instance, bias enable logic circuit 220 may be a simple count down counter or the like. Bias enable logic circuit 220 anticipates the timing of appropriate signal edges in the reference signal 162 so as to selectively enable/disable a current source 230 in the charge pump 218 depending on the state of the PLL 200. When the input signals to the phase detector 212 indicate that the output signal 182 has not yet locked to the reference signal 162, and thus signals 162,182 are significantly out of phase and the PLL is in an unlocked state, the bias enable logic circuit 220 enables the current source 230 in the charge pump 218. Conversely, when the PLL 200 is in a locked state, the bias enable logic circuit 220 enables and disables the current source 230 periodically to conserve power.

Figure 6:
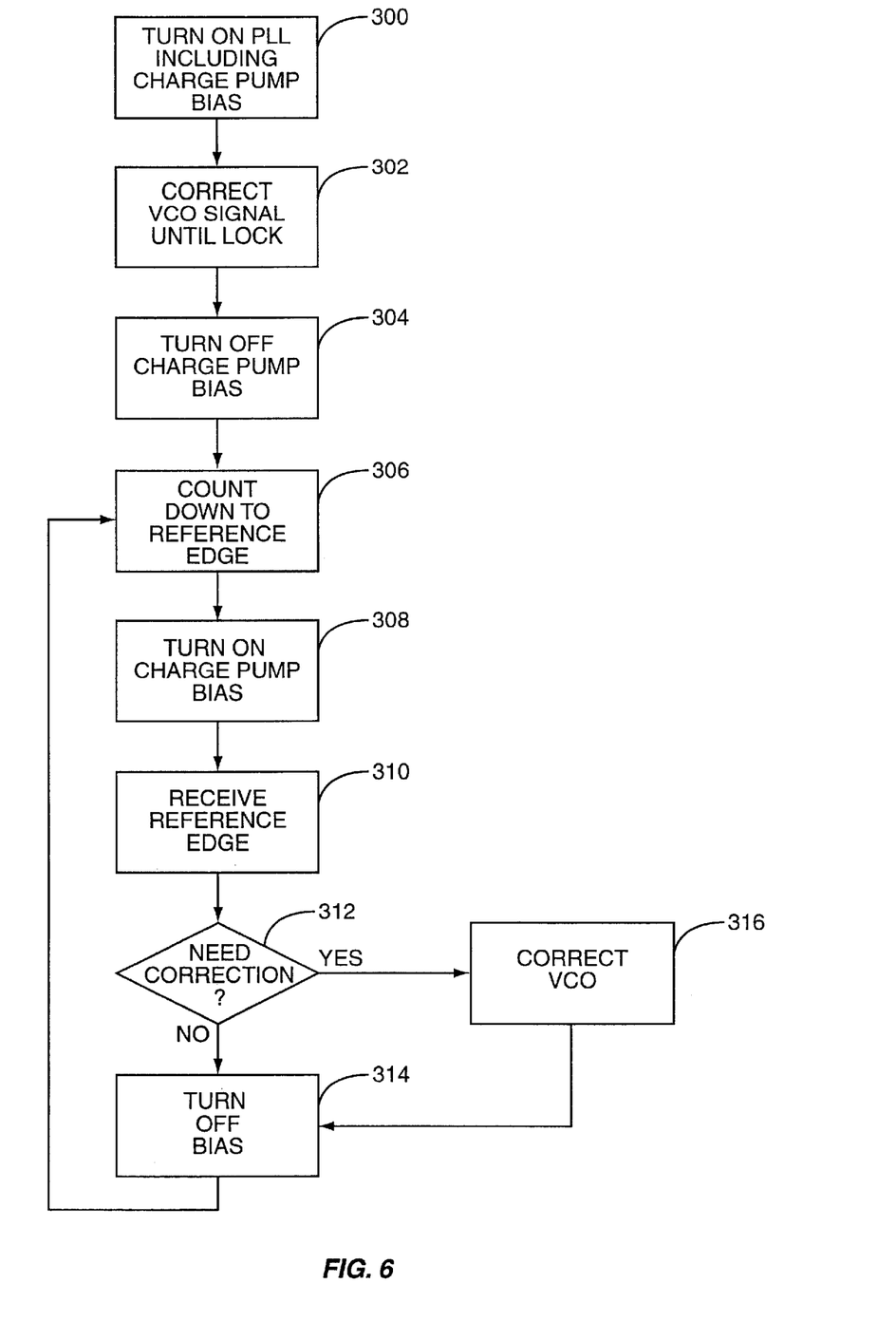
FIG. 6 is a flow chart of the activity of the phase-locked loop of FIG. 4.

In practice, the PLL 200 operates as generally described with reference to FIG. 6. Initially, the PLL 200 is turned on, and switch 232 is closed to include the bias current source 230 (block 300). This may occur for example, when a mobile terminal 20 leaves a sleep mode or when a radio is turned on. Initially, the reference signal 162 from the reference divider 160 and the feedback signal 192 from the feedback divider 190 are out of phase and the bias current source 230 is preferably enabled continuously. PLL 200 is designed to synchronize the arrival of corresponding signal edges of the feedback signal 192 and the reference signal 162. To this end, the phase detector 212 generates phase error signal 214 that controls the charge pump 218. Charge pump 218 generates a correction signal 219 that is applied to the VCO 180 after being filtered by optional loop filter 175. The correction signal 219 causes the output of the VCO 180 to deviate in the direction of the reference signal 162 until the feedback signal 192 is synchronized, or locked, onto the reference signal 162 (block 302). Before a locked state is detected, the biasing current source 230 should be turned on continuously to facilitate quick locking of the output signal 182.

When PLL 200 achieves a locked state, a lock signal is generated by lock detect circuit 216 that is fed to the bias enable logic circuit 220. When the PLL 200 is locked, corrections are expected to be very close in time to the reference signal edges. Therefore, a bias current need only be generated for a short period of time encompassing the arrival of a reference signal edge. Because the bias enable logic circuit 220 also receives the reference signal 162, bias enable logic circuit 220 is able to anticipate the arrival of reference signal edges in the square wave of the reference signal 162. These can be the leading signal edges or the trailing signal edges. According to the present invention, the bias enable logic circuit 220 turns the current source 230 on and off periodically by closing and opening switch 232 (block 304) while the PLL 200 is in a locked state. The "on" periods coincide with the occurrence of a reference signal edge. Prior to the arrival of each of the reference signal edges, bias enable logic circuit 220 turns on the current source 230 via switch 232, biasing the transistors 240 within the charge pump 218 (block 308). After the reference signal edge is received by the phase detector 212 (block 310), the phase detector 212 determines if a correction is needed to the output signal 182 by comparing the feedback signal 192 and the reference signal 162 (block 312). If a correction is needed, then a phase error signal 214 is generated as previously described and the VCO output signal 182 is corrected (block 316). After correction, or if no correction is needed, bias enable logic circuit 220 turns off the current source 230 (block 314) until proximate in time to the arrival of the next reference signal edge (back to block 306).

While it is conceivable that this switching of the current source 230 could operate when the PLL 200 is not in a locked state, such is not preferred, and the switching preferably only occurs when the PLL 200 is turned on and in a locked state. It should further be appreciated that in the preferred embodiment this switching turns the biasing current source 230 on and off for each expected reference signal edge (i.e., once per period of the reference signal 55). However, it is also possible to leave the biasing current source 230 on for more than one period. This would still effectuate a power savings, but not to the same degree as turning the biasing current source 230 on and off in each period.

Figure 7:
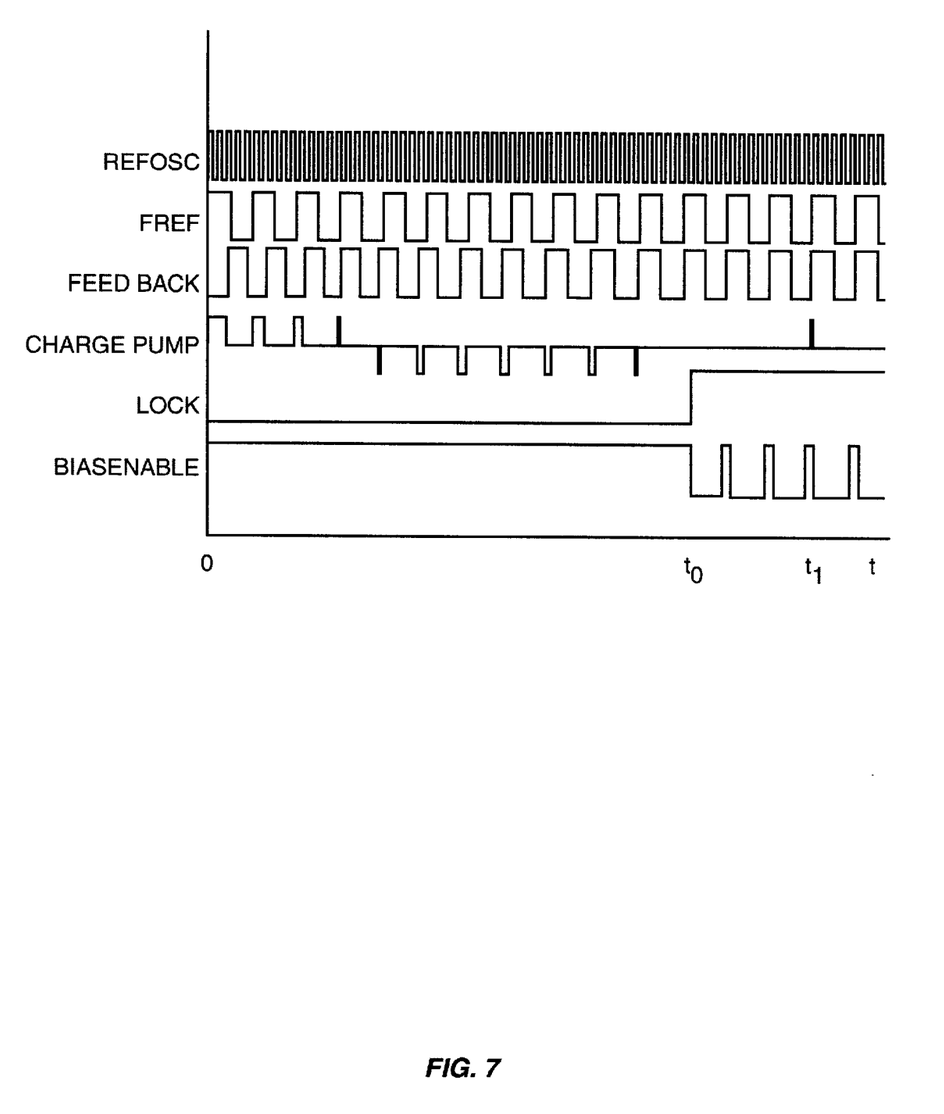
FIG. 7 is a graph of some relevant signals versus time.

An example of how the preferred embodiment might work in practice is seen in FIG. 7. The top signal, REFOSC, represents the signal from the reference oscillator 100. The FREF signal represents the reference signal 162 output by the reference divider 160. The FEEDBACK signal represents the feedback signal 192 output from the feedback divider 190. At time t near 0, the respective rising edges of FREF and FEEDBACK are out of phase. The LOCK signal is not enabled and the charge pump 218 generates a periodic correction signal 219 as shown by the CHARGE PUMP signal in FIG. 7. Because of the frequency of the required corrections, the BIASENABLE signal from the bias enable logic circuit 220 is on continuously, corresponding to switch 232 being closed and current source 230 being on continuously. At time to, the reference signal FREF and the FEEDBACK signal are in phase corresponding to the PLL 200 being locked. The LOCK signal from the lock detect circuit 216 is enabled to represent this fact and is passed to the bias enable logic circuit 220. Bias enable logic circuit 220 then implements the present invention and turns off the BIASENABLE signal, corresponding to opening switch 232 and turning off current source 230. At periodic intervals encapsulating the arrival of a signal edge of reference signal 162, the bias enable logic circuit 220 turns the current source 230 on and off periodically. In the preferred embodiment, the BIASENABLE signal turns the current source 230 on immediately prior to the arrival of a rising edge of reference signal 162 and turns off the current source 230 after the rising edge has passed the phase detector 212 but before the next rising edge. At time $t_1$ a correction is needed as seen by the spike in the CHARGE PUMP signal. In the preferred embodiment, the turning on and off of the current source 230 operates at approximately a ten percent duty cycle representing approximately a ninety percent power savings, thus greatly extending the life of any battery powering the PLL 200. As noted, different duty cycles or even changing the period of the BIASENABLE signal to encapsulate ≈1.5, 2.5, etc. periods of the FREF signal, is also possible, but not preferred.

The present invention is designed to be used during the time that the phase-locked loop 200 is active. For most applications, active states will not occur on a periodic cycle; rather the active state will be throughout the time that the device is turned on. However, it is known in the mobile communications industry to operate a mobile terminal 20 in a wake/sleep fashion to conserve power where the entire receiver chain within the mobile terminal is periodically put to sleep (i.e., essentially turned off), but periodically awakened to receive and demodulate a paging channel. This is well understood in the prior art. In contrast to sleeping and waking, the present invention is intended to modify the operation of the phase-locked loop 200 while the phase-locked loop 200 is active (not sleeping).

Frequency synthesizer 128 and/or frequency synthesizer 118 of FIG. 2 may be replaced with the phase-locked loop 200 of the present invention, thereby providing a receiver chain for a wireless communications mobile terminal 20 that consumes less power.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method for controlling a phase-locked loop having a charge pump requiring a bias current source to provide a correction to an output of said phase-locked loop, said method comprising:
   a) detecting when said phase-locked loop is in a locked state; and
   b) periodically enabling and disabling said current source when said phase-locked loop is in said locked state.

2. The method of claim 1 further including enabling said current source when said phase-locked loop is not in said locked state.

3. The method of claim 1 wherein said periodically enabling and disabling said current source includes receiving a periodic reference signal containing a series of pulses with leading and trailing signal edges, enabling said current source before the arrival of a first selected signal edge, and disabling said current source before the arrival of a subsequent second signal edge.

4. The method of claim 3 wherein said first and second signal edges are leading signal edges.

5. The method of claim 3 wherein said first and second signal edges are trailing signal edges.

6. The method of claim 3 wherein said first and second signal edges are from consecutive pulses in the reference signal.

7. The method of claim 1 wherein said periodically enabling and disabling said current source includes closing and opening a switch, respectively, said switch operatively connecting said current source to the output of said charge pump when closed.

8. A method of controlling a phase-locked loop having a phase detector and a charge pump, said charge pump requiring a bias current to provide correction to an output of the phase-locked loop, said method comprising:
   a) receiving a reference signal at said phase detector having a plurality of signal edges;
   b) detecting a locked state for said phase-locked loop and turning off the bias current in the charge pump;
   c) thereafter, turning on the bias current in the charge pump prior to the arrival of a selected signal edge in said reference signal; and
   d) thereafter, turning off the bias current in the charge pump a predetermined amount of time after said selected edge arrives.

9. The method of claim 8 wherein said reference signal is supplied by a reference oscillator and further including anticipating the arrival of said selected signal edge from the reference oscillator.

10. The method of claim 8 further including turning on said bias current prior to said detecting a locked state for said phase-locked loop.

11. The method of claim 8 wherein said reference signal is periodic and wherein said predetermined amount of time is substantially shorter than the period of said reference signal.

12. The method of claim 8 further including, after said detecting, repeatedly both turning on said bias current prior to the arrival of selected signal edges in said reference signal and turning off said bias current a predetermined amount of time thereafter.

13. The method of claim 12 wherein said reference signal is periodic and wherein said predetermined amount of time is substantially shorter than the period of said reference signal.

14. The method of claim 13 wherein said repeatedly turning on said bias current and repeatedly turning off said bias current results in duty cycle of approximately ten percent for said bias current.

15. A phase-locked loop responsive to a reference signal derived from a reference source and having a plurality of signal edges, comprising:
   a charge pump having a bias current source;
   a switch, said switch operative to selectively enable said bias current source for said charge pump;
   a bias enable circuit operatively connected to said switch, said bias enable circuit operative to control said switch; and
   wherein said switch enables said current source prior to reception of one of said signal edges and disables said current source after reception of said signal edge when said phase-locked loop is in a locked state.

16. The phase-locked loop of claim 15 further including a lock detect circuit operatively connected to said switch to detect when said phase-locked loop is in said locked state.

17. The phase-locked loop of claim 15 further including a voltage controlled oscillator connected to said charge pump and receiving the output of said charge pump.

18. The phase-locked loop of claim 15 further including a reference divider, said reference divider deriving said reference signal.

19. A phase-locked loop comprising:
   a) a phase detector;
   b) a charge pump operatively connected to said phase detector, said charge pump including a current source;
   c) a voltage controlled oscillator having a control input and an output, said control input operatively connected to said charge pump and said output operatively connected to an input of said phase detector;
   d) a lock detect circuit operative to detect when said phase-locked loop is in a locked state; and
   e) control logic connected to said charge pump and said lock detect circuit, said control logic:
      i) enabling said current source when the phase-locked loop is not in said locked state; and
      ii) periodically enabling and disabling said current source when the phase-locked loop is in said locked state.

20. A wireless communications mobile terminal, comprising:
   a receiver operatively connected to a frequency synthesizer;
   a reference source for generating a periodic signal comprising a plurality of signal edges, said reference source connected to said frequency synthesizer;
   said frequency synthesizer comprising a phase-locked loop and receiving said periodic signal;
   said phase-locked loop comprising:
      a charge pump having a bias current source;
      a switch to selectively enable said bias current source for said charge pump;
      a logic circuit operatively connected to said switch, said logic circuit operative to control said switch; and
      wherein said switch enables said current source prior to reception of one of said signal edges and disables said current source after reception of said signal edge when said phase-locked loop is in a locked state.

21. The mobile terminal of claim 20 wherein charge pump generates a control signal and wherein said phase-locked loop further includes a voltage controlled oscillator responsive to said control signal to generate the output signal of said phase-locked loop.

22. The mobile terminal of claim 20 wherein said phase-locked loop includes reference divider to divide said periodic signal to generate a reference signal having a plurality of signal edges and wherein said switch enables said current source prior to reception of one of said signal edges from said reference divider and disables said current source after reception of said signal edge from said reference divider when said phase-locked loop is in a locked state.

23. The mobile terminal of claim 20 wherein said phase-locked loop further comprises a lock detect circuit generating a lock signal when said phase-locked loop is in a locked state, said logic circuit receiving said lock signal, said logic circuit controlling said switch to enable said current source prior to reception of one of said signal edges and disable said current source after reception of said signal edge in response to said lock signal.

24. The mobile terminal of claim 23 wherein said logic circuit enables said bias current source a predetermined time period before the arrival said signal edge.

25. The mobile terminal of claim 23 wherein said logic circuit causes said switch to disable said bias current source before the arrival of the next subsequent signal edge.

26. The mobile terminal of claim 22 wherein said switch causes said current source to have a duty cycle of less than eighty percent when said phase-locked loop is in said locked state.

27. The mobile terminal of claim 26 wherein said switch causes said current source to have a duty cycle of less than fifty percent when said phase-locked loop is in said locked state.

* * * * *